(12) United States Patent
Gan et al.

(10) Patent No.: US 8,872,575 B2
(45) Date of Patent: Oct. 28, 2014

(54) SEMICONDUCTOR DEVICE

(75) Inventors: Zhenghao Gan, Shanghai (CN); Junhong Feng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 13/243,437

(22) Filed: Sep. 23, 2011

(65) Prior Publication Data

US 2012/0274384 A1 Nov. 1, 2012

(30) Foreign Application Priority Data

Apr. 29, 2011 (CN) .......................... 2011 1 0110159

(51) Int. Cl.
| | |
|---|---|
| H03K 17/16 | (2006.01) |
| H03K 17/30 | (2006.01) |
| G05F 1/10 | (2006.01) |
| G05F 3/02 | (2006.01) |
| H03K 17/14 | (2006.01) |

(52) U.S. Cl.
CPC .................................. H03K 17/145 (2013.01)
USPC ................................ 327/379; 327/543; 326/9

(58) Field of Classification Search
CPC ................. H03K 19/00361; H03K 19/00315; H03K 19/00384; H03K 2005/00143; H03K 3/0375; H03K 17/162; H01L 2224/48247; H01L 2924/13091; G11C 7/04; G11C 7/12; G11C 11/4074; G11C 13/0026; G05F 3/262; H02M 1/32
USPC ......... 327/108–112, 379, 534, 543, 427, 551, 327/330, 333; 326/9, 68
See application file for complete search history.

(56) References Cited

U.S. PATENT DOCUMENTS

| | | | | |
|---|---|---|---|---|
| 6,326,819 | B1 * | 12/2001 | Carlson .......................... | 327/108 |
| 7,868,560 | B2 * | 1/2011 | Gong et al. .................... | 315/291 |

FOREIGN PATENT DOCUMENTS

CN 102760764 10/2012

OTHER PUBLICATIONS

Lin Li; Youtao Zhang; Jun Yang, "Proactive recovery for BTI in high-k SRAM cells," Design, Automation & Test in Europe Conference & Exhibition (DATE), 2011 , vol., No., pp. 1,6, Mar. 14-18, 2011.*

(Continued)

Primary Examiner — Lincoln Donovan
Assistant Examiner — Thomas Skibinski
(74) Attorney, Agent, or Firm — Koppel, Patrick, Heybl & Philpott (57) ABSTRACT

The present invention discloses a semiconductor device and relates to the semiconductor field. The semiconductor device comprises: a PMOS transistor for processing a input signal, the PMOS transistor comprising a gate and a source, the source being connected to a first voltage source; and a restoring circuit connected to the PMOS transistor for preventing degradation of the PMOS transistor, wherein the restoring circuit makes the gate voltage of the PMOS transistor to be higher than the voltage of the first voltage source, when the input signal is at a high level. According to the semiconductor device of the present invention, a positive bias voltage is applied on the gate of the PMOS transistor through the restoring circuit when the PMOS transistor is turned off, which can accelerate electric parameter recovery for PMOS transistors and therefore improve the performance of PMOS transistors.

16 Claims, 7 Drawing Sheets

(56) References Cited

OTHER PUBLICATIONS

Shin, J.; Zyuban, V.; Bose, P.; Pinkston, T.M., "A Proactive Wearout Recovery Approach for Exploiting Microarchitectural Redundancy to Extend Cache SRAM Lifetime," Computer Architecture, 2008. ISCA '08. 35th International Symposium on, vol., No., pp. 353,362, Jun. 21-25, 2008.*

Notice of Filing Chinese Patent Appl, No. 201110110159.5, dated Apr. 29, 2011.

Foreign Filing Permit from Chinese Patent Appl. No. 201110110159.5, dated Apr. 29, 2011.

Invention Disclosure Application Form from Semiconductor Mfg. International Corp.

Office Action from corresponding Chinese Patent appl. No. 20110110159.5, issued Apr. 23, 2014.

Li, et al., "Proactive NBTI Mitigation for Busy Functional Units in Out-of-Order Microprocessors", Design, automation & Test in Europe Conference & Exhibition, 2010, 9783-9810801-2-2/Date10 © 2010EDAA.

Shin, et al., "A Proactive Wearout Recovery Approach for Exploiting Microarchitectural Redundancy to Extend Cache SRAM Lifetime", to appear in the International Symposium on Computer Architecture (ISCA), 2008.

Li, et al., "Proactive Recovery for BTI in Higy-$k$ SRAM Cells", 978-3-9810801-7-9/Date11 © 2011 EDAA.

\* cited by examiner

SEMICONDUCTOR DEVICE

CROSS-REFERENCE TO RELATED APPLICATIONS

This application claims priority to Chinese Patent Application No. 201110110159.5, filed on Apr. 29, 2011 and entitled "SEMICONDUCTOR DEVICE", which is incorporated herein by reference in its entirety.

BACKGROUND OF THE INVENTION

1. Field of the Invention

The present invention relates to the field of semiconductor techniques, and particularly, to a semiconductor device.

2. Description of the Related Art

In modern semiconductor techniques, PMOS (P-channel Metal-Oxide-Semiconductor Field-effect Transistor) transistors work with negative bias voltage over a long term, which may lead to changes in electronic parameters of PMOS transistors, PMOS transistor degradation, or even cause failures. For example, in modern CMOS (Complementary Metal oxide Semiconductor) techniques, the NBTI (Negative Bias Temperature Instability) effect of PMOS transistors is a problem of primarily concern in terms of reliability.

The NBTI effect refers to the degradation of a series of electronic parameters at a high temperature due to the negative gate voltage applied to PMOS transistors. The creation of the NBTI effect mainly relates to the generation of positive charges and Passivation, that is, the generation of interface trapped charges and fixed oxide charges and the diffusion of diffusive materials; hydrogen and moisture are two major substances that can cause NBTI. Traditionally, the creation of NBTI may contribute to the fact that inversion layer holes are thermally excited under a high temperature and a negative bias voltage applied to a PMOS transistor and tunnel to the interface of Si/SiO2. Because there are a lot of Si—H bonds at the interface, the thermally excited holes react with Si—H bonds to produce H atoms, leaving dangling bonds at the interface. Due to the instability of H atoms, two H atoms may combine with each other, released in the form of hydrogen molecules, leading to negative threshold voltage shift.

Thus, the NBTI effect can cause issues, such as the rise of gate current, negative threshold voltage shifting after a long term of work, for PMOS transistors.

SUMMARY OF THE INVENTION

The present invention is proposed in view of the above-identified problems.

One technical problem to be resolved by this disclosure is to provide a semiconductor device capable of improving the performance of PMOS transistors in semiconductor devices.

According to one aspect of the present invention, there is provided a semiconductor device, which may comprise: a PMOS transistor for processing a input signal, the PMOS transistor comprising a gate and a source, the source being connected to a first voltage source; and a restoring circuit connected to the PMOS transistor for preventing degradation of the PMOS transistor, wherein the restoring circuit makes the gate voltage of the PMOS transistor to be higher than the voltage of the first voltage source, when the input signal is at a high level.

In the semiconductor device provided according to one aspect of this disclosure, when the PMOS transistor is turned off, a positive bias voltage is applied on the gate of the PMOS transistor through the restoring circuit, accelerating electric parameter restoring of the PMOS transistor, and preventing or at least alleviating performance degradation of the PMOS transistor.

DESCRIPTION OF THE EMBODIMENTS

The present invention will be described more thoroughly with reference to accompanying drawings in which exemplary embodiments of the present invention are illustrated. In the drawings, same reference numerals designate same or like components or elements.

Figure 8:
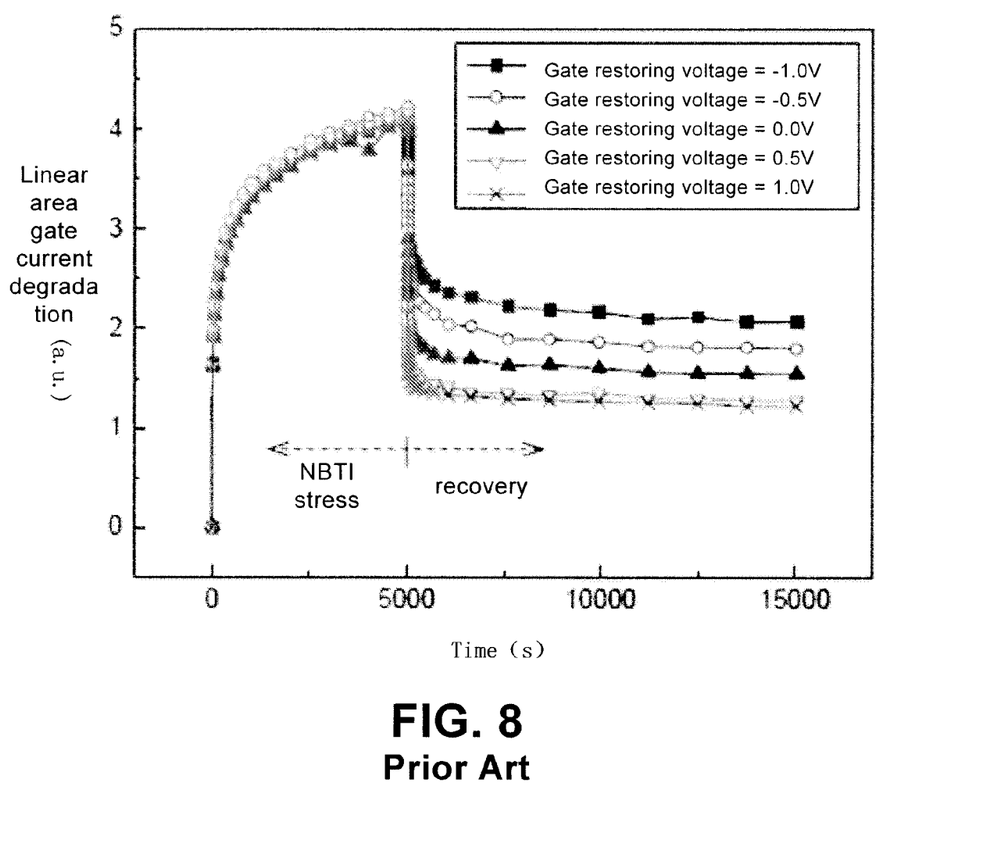
FIG. 8 is a profile showing the correlation between the restoring of NBTI-induced degradation and restoring voltage.

Electric parameter changes induced by NBTI may get restored after the removal of voltage stress. Restoring from degraded NBTI after removing voltage stress is a well known phenomenon (particularly, for nitride oxide), however, the inventors of the present invention have not found any attempts of a person ordinarily skilled in the art to prevent or eliminate or at least alleviate PMOS transistor performance degradation by means of such phenomenon. The inventors have found in their studies that the recovery speed (or passivation speed) is correlated with the electric field. As shown in FIG. 8, the portion of the curve indicated by a left arrow represents a NBTI stress curve (under conditions of gate stress voltage=−2.2V, gate oxide thickness=2.0 nm, temperature=105° C.); the portion of the curve indicated by a right arrow represents recovery from different gate restoring voltages, that is, gate restoring voltage=−1.0V, gate restoring voltage=−0.5V, gate restoring voltage=0.0V, gate restoring voltage=0.5V, gate restoring voltage=1.0V, respectively. It can be seen from FIG. 8 that a larger positive bias voltage applied during the restoring stage may cause a faster recovery.

Figure 1:
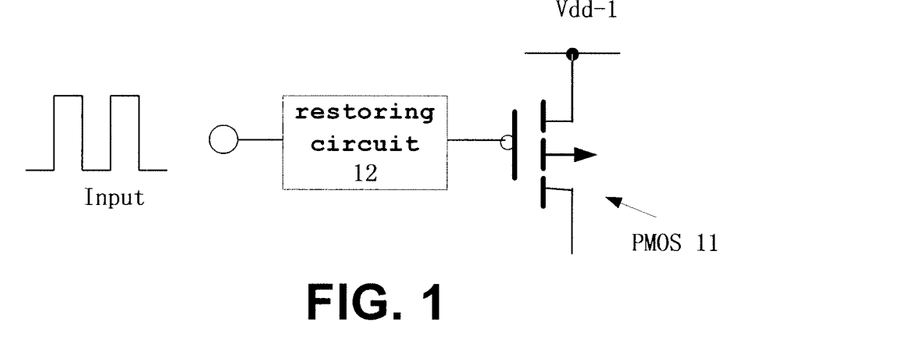
FIG. 1 shows a structure diagram of a semiconductor device according to a first embodiment of the present invention.

FIG. 1 shows a structure diagram of the semiconductor device according to a first embodiment of the present invention. As shown in FIG. 1, the semiconductor device comprises a PMOS transistor 11 and a restoring circuit 12 which is connected with the PMOS transistor 11 and is used for preventing degradation of the PMOS transistor 11. The PMOS transistor 11 comprises a gate connected to the restoring circuit 12 and a source connected to a first voltage source. The drain of the PMOS transistor is used as the output of the PMOS transistor. The PMOS transistor processes an input signal; when the input signal is at a high level, the restoring circuit 12 makes the gate voltage of the PMOS transistor 11 higher than the voltage of the first voltage source Vdd-1. According to one embodiment of the present invention, when the input signal is at a low level, the restoring circuit 12 makes the gate voltage of the PMOS transistor 11 have a magnitude substantially equal to that of the voltage of the input signal. The restoring circuit is often implemented together with the PMOS transistor as an on-chip circuit.

In the above embodiment, since the restoring circuit applies a positive voltage to the PMOS transistor when it is turned off, electric parameter restoring is accelerated for the PMOS transistor, preventing PMOS transistor degradation and improving PMOS transistor performance, and therefore, prolonging the life-time of the PMOS transistor.

In addition to the preferred embodiments of the present invention taught below in conjunction with drawings, those of ordinary skill in the art will appreciate that the restoring circuit of the presenting invention also can be designed and implemented in other prior art manners.

Figure 2:
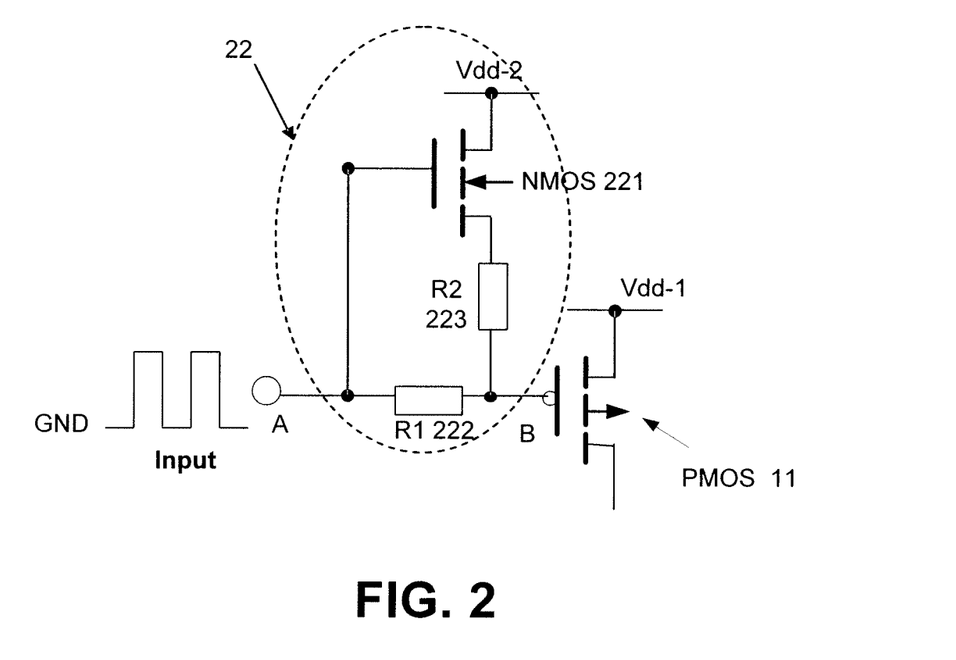
FIG. 2 shows a structure diagram of a semiconductor device according to a second embodiment of the present invention.

FIG. 2 shows a structure diagram of the semiconductor device according to a second embodiment of the present invention. As shown in FIG. 2, the semiconductor device comprises a PMOS transistor 11 and a restoring circuit 22, wherein the restoring circuit 22 comprises a NMOS transistor (N-channel metal-Oxide-Semiconductor-Field-effect Transistor) 221 and a resistor R1 222; optionally, the restoring circuit 22 can further comprise a resistor R2 223. The NMOS transistor 221 comprises a gate, a source, and a drain; a first end (A end) of the resistor R1 222 is used to receive input signals and is connected with the gate of the NMOS transistor 221, a second end (B end) of the resistor R1 222 is connected with the gate of the PMOS transistor 11, the second end of the resistor R1 222 is also connected to the source of the NMOS transistor 221 (or through resistor R2 223). The drain of the NMOS transistor 221 is connected to a second voltage source Vdd-2 having a voltage (for example, 1.5V, 1.7V, 2.5V, 3.3V) higher than the voltage of the first voltage source Vdd-1 (for example, 0.9V, 1.0V, 1.2V).

In the above embodiment, when the PMOS transistor is turned off, the restoring circuit applies a positive bias voltage to the PMOS transistor by means of the NMOS transistor, and PMOS transistor degradation can get more recovery in this way.

Note that, the resistor R2 223 shown in FIG. 2 is connected between the source of the NMOS transistor 221 and the gate of the PMOS transistor 11 and serves as a voltage divider. In other embodiments, the resistor R2 223 can also be connected between the second voltage source Vdd-2 and the drain of the NMOS transistor 221.

The resistors R1 and R2 can be polysilicon resistors or metal line resistors.

Figure 3A:
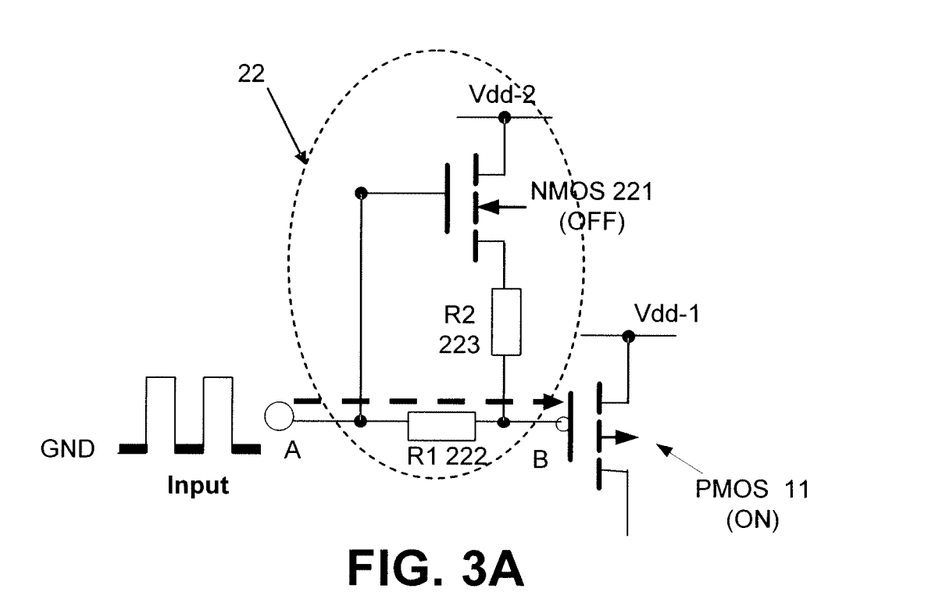
FIG. 3A shows a schematic operation state diagram of the embodiment shown in FIG. 2 when its input signal is at a low level.

The operation process of the semiconductor device shown in FIG. 2 will be described with reference to FIGS. 3A, 3B below. In FIG. 3A, the voltage of the first voltage source is, for example, the operation voltage of kernel circuits of the semiconductor device, the voltage of the second voltage source is, for example, the supply voltage of peripheral circuits of the semiconductor device.

FIG. 3A is a diagram showing the working state of the embodiment of FIG. 2 when the input signal is at a low level.

As shown in FIG. 3A, the supply voltage Vdd-2 (e.g., 2.5V) connected with the drain of the NMOS transistor 221 is higher than the source supply voltage Vdd-1 (e.g., 1.2V) of the PMOS transistor 11, when the input signal is at a low level (e.g., GND), the NMOS transistor 221 is turned off, and the PMOS transistor 11 is turned on. Since the gate leakage through the R1 222 is always low, the input voltage inputted at A point is directly connected to B point, ensuring that the PMOS transistor 11 is turned on.

Figure 3B:
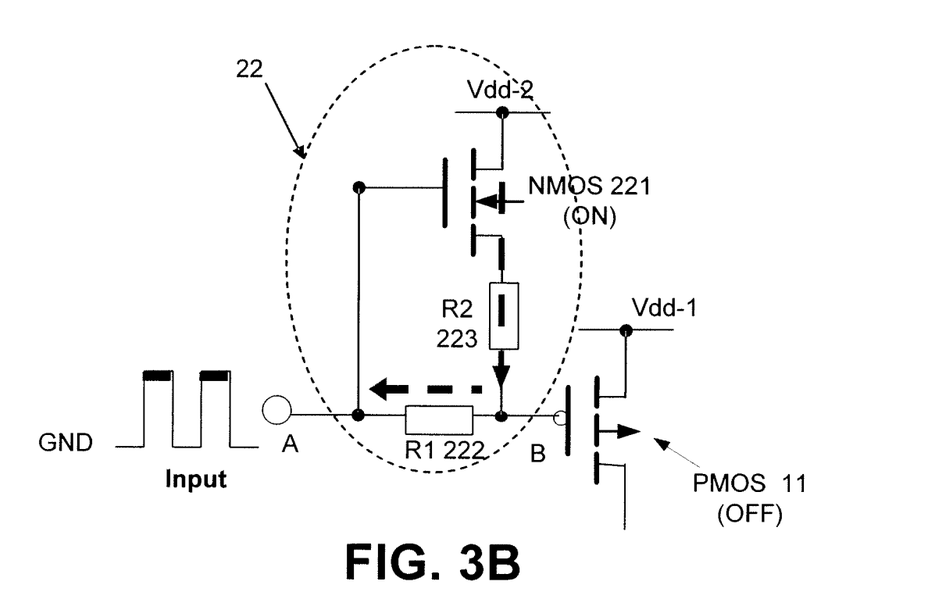
FIG. 3B shows a schematic operation state diagram of the embodiment shown in FIG. 2 when its input signal is at a high level.

FIG. 3B shows a working state diagram of the embodiment of FIG. 2 when the input signal is at a higher level. As shown in FIG. 3B, the supply voltage Vdd-2 connected with the drain of the NMOS transistor 221 (e.g., 2.5V) is higher than the source supply voltage Vdd-1 (e.g., 1.2V) of the PMOS transistor 11, when the input signal is at a high level (e.g., Vdd-1), the NMOS transistor 221 is turned on, and the PMOS transistor 11 is turned off. The voltage at B point is lower than Vdd-2 (e.g., 2.5V) and higher than Vdd-1 (e.g., 1.2V), and a positive bias voltage is applied on the PMOS transistor 11 when it is turned off. The voltage at B point can be tuned through adjusting the resistance of R2 223.

Figure 4:
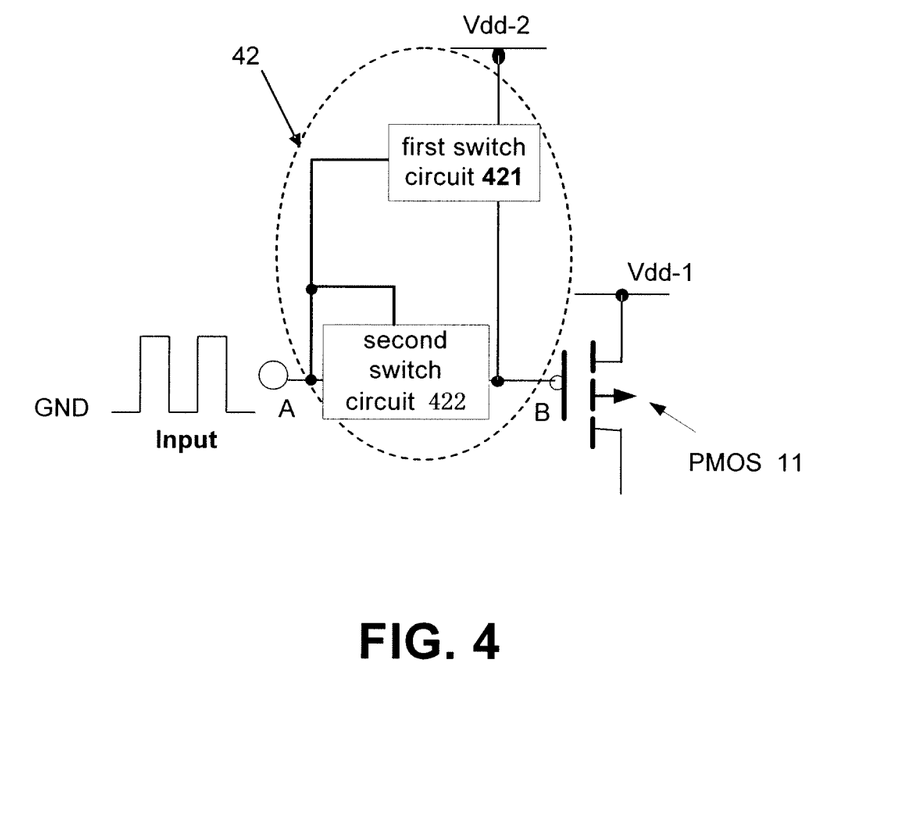
FIG. 4 shows a structure diagram of a semiconductor device according to a third embodiment of the present invention.

FIG. 4 shows the structure diagram of a semiconductor device according to a third embodiment of the present invention. As shown in FIG. 4, in this embodiment, the semiconductor device comprises a PMOS transistor 11 and a restoring circuit 42. Wherein, the restoring circuit 42 comprises a first switch circuit 421 and a second switch circuit 422. The first switch circuit 421 is connected between the gate of the PMOS transistor 11 and a second voltage source Vdd-2 having a voltage higher than the voltage of the first voltage source Vdd-1; the second switch circuit 422 is connected between the input signal and the gate of the PMOS transistor 11; the input signal is further connected to the control terminal of the first switch circuit 421 and the control terminal of the second switch circuit; when the input signal is at a high level, the first switch circuit 421 is turned off and the second switch circuit 422 is turned on. When the input signal is at a low level, the first switch circuit 421 is turned on and the second switch circuit 422 is turned off, causing the gate voltage of the PMOS transistor 11 to have a magnitude substantially equal to that of the voltage of the input signal.

According to one embodiment of the present invention, the restoring circuit 42 can further comprise a resistor connected in series between the first switch circuit 421 and the gate of the PMOS transistor 11, or between the input signal and the first switch circuit 421.

Figure 5:
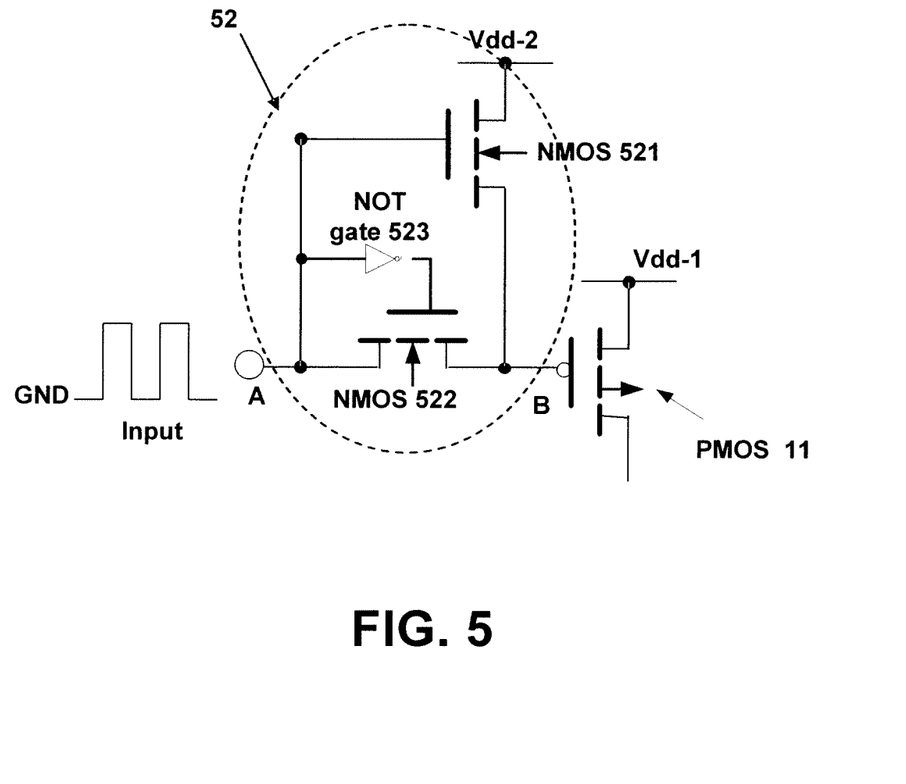
FIG. 5 shows a structure diagram of a semiconductor device according to a fourth embodiment of the present invention.

FIG. 5 shows the structure diagram of a semiconductor device according to a forth embodiment of the present invention. As shown in FIG. 5, in this embodiment, the semiconductor device comprises a PMOS transistor 11 and a restoring circuit 52, wherein the restoring circuit 52 comprises a first NMOS transistor 521, a second NMOS transistor 522 and a NOT gate 523. The first NMOS transistor 521 corresponds to the first switch circuit, which comprises a gate, a source, and a drain, and the gate of the first NMOS transistor 521 is the control terminal of the first switch circuit. The second NMOS transistor 522, which comprises a gate, a source, and a drain, and the NOT gate 523 corresponds to the second switch circuit, and the input of the NOT gate 523 is the control terminal of the second switch circuit, the output of the NOT gate 523 is connected to the gate of the second NMOS transistor 522; the first NMOS transistor 521 has its drain connected to the second voltage source Vdd-2, the source of the first NMOS transistor 521 is connected to the gate of the PMOS transistor 11; the second NMOS transistor 522 has its drain connected to the input signal, and the source of the second NMOS transistor 522 is connected to the gate of the PMOS transistor 11. According to one embodiment of the present invention, the NOT gate 523 is an inverter formed from a NMOS transistor.

In the above embodiment, as compared to the restoring circuit implemented by a resistor, when the PMOS transistor is turned off, such restoring circuit consisted of the first NMOS transistor, the second NMOS transistor and the NOT gate applied a positive bias voltage on the PMOS transistor, which not only can accelerate PMOS transistor recovery, but also can prevent the occurrence of a relatively large current in the restoring circuit, enhancing the stability and reliability of the restoring circuit.

Figure 6A:
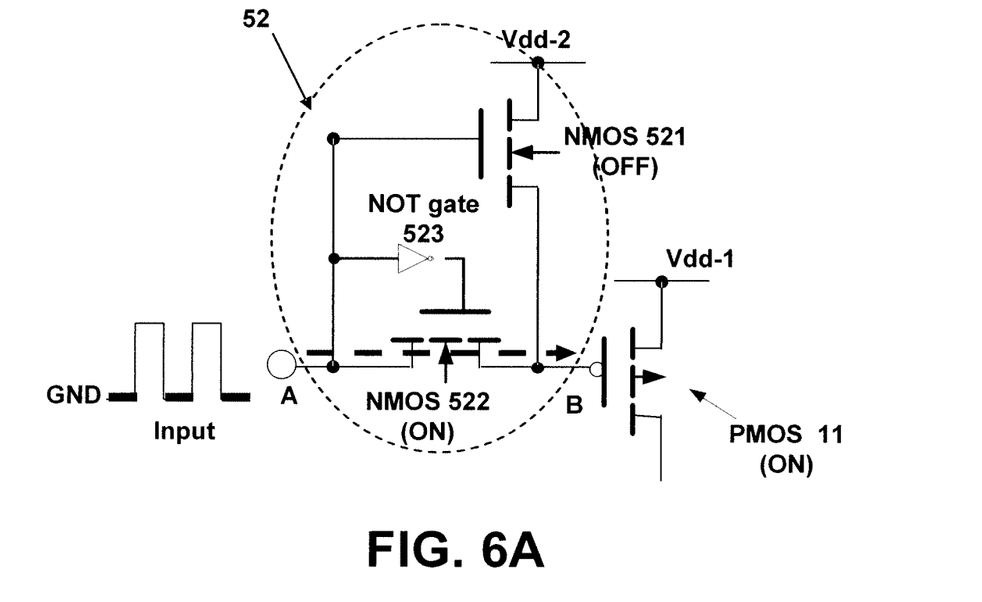
FIG. 6A shows a schematic operation state diagram of the embodiment shown in FIG. 5 when its input signal is at a low level.

FIG. 6A is a schematic diagram showing the working state of the embodiment of FIG. 5 when the input signal is at a low level. As shown in FIG. 6A, the supply voltage Vdd-2 connected with the drain of the first NMOS transistor 521 (e.g., 2.5V) is higher than the source supply voltage Vdd-1 (e.g., 1.2V) of the PMOS transistor 11, when the input signal is at a low level (e.g., GND), the first NMOS transistor 521 is turned off (OFF), and the second NMOS transistor 522 is turned on (ON), the input signal voltage at point A is directly connected to point B, causing the PMOS transistor 11 to turn on.

Figure 6B:
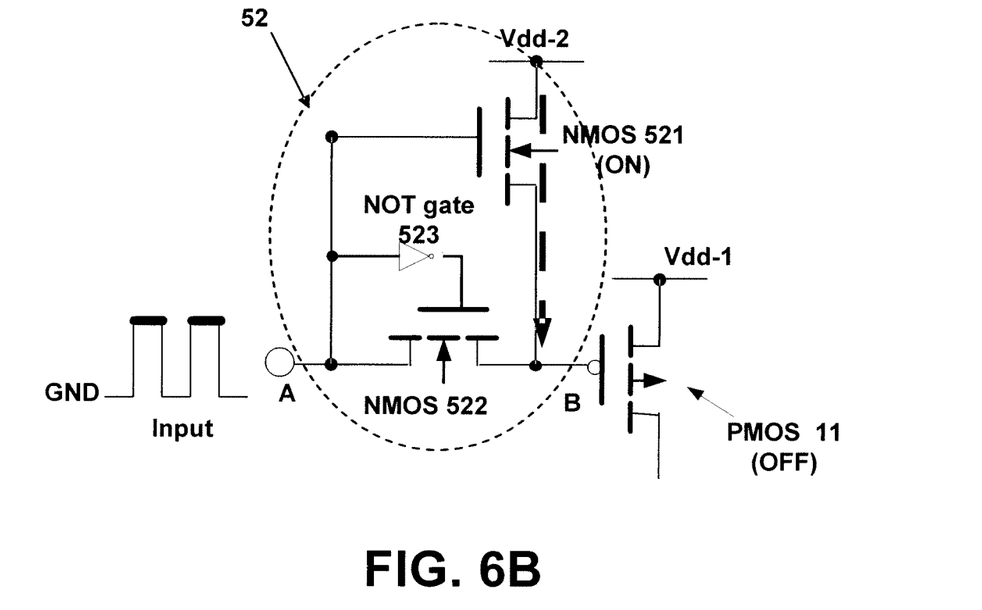
FIG. 6B shows a schematic operation state diagram of the embodiment shown in FIG. 5 when its input signal is at a high level.

FIG. 6B is a schematic diagram showing the working state of the embodiment of FIG. 5 when the input signal is at a high level. As shown in FIG. 6B, the supply voltage Vdd-2 connected with the drain of the first NMOS transistor 521 (e.g., 2.5V) is higher than the source supply voltage Vdd-1 (e.g., 1.2V) of the PMOS transistor 11, when the input signal is at a high level (e.g., Vdd-1), the first NMOS transistor 521 is turned on (ON), and the second NMOS transistor 522 is turned off (OFF), the voltage at point B is higher than Vdd-1 (e.g., 1.2V), and a positive bias voltage is applied to the PMOS transistor 11 when the PMOS transistor 11 is not in activation.

It should be noted that, the restoring circuit of FIG. 5 also can comprise a resistor connected between the source of the first NMOS transistor 521 and the gate of the PMOS transistor 11 as a voltage divider. In other embodiments, a divider resistor can be connected in series between the second voltage source Vdd-2 and the drain of the first NMOS transistor 521.

Figure 7:
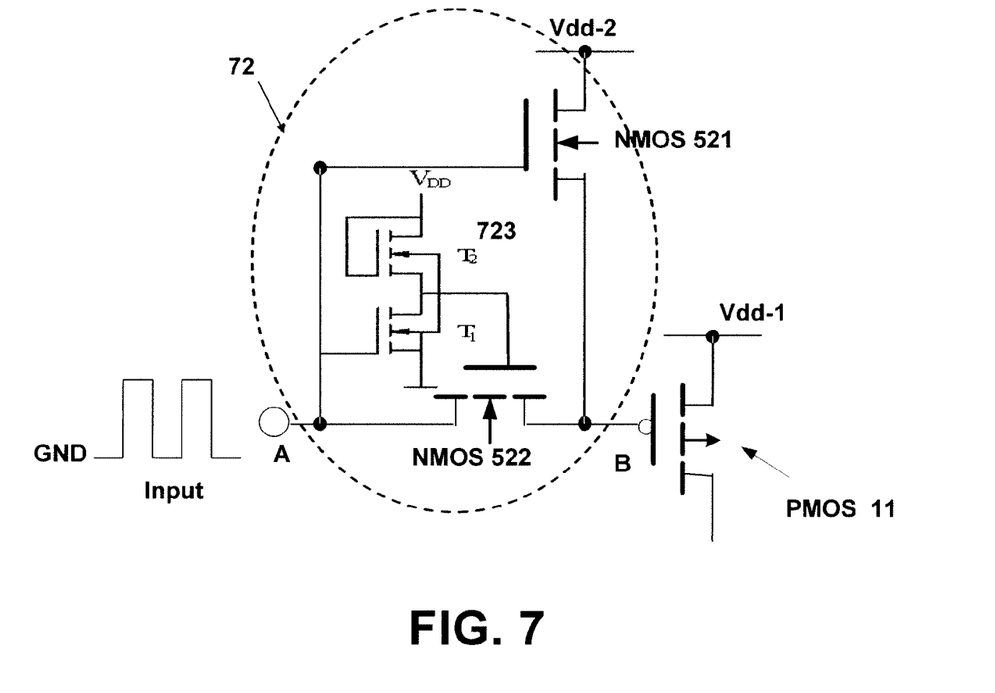
FIG. 7 shows a structure diagram of a semiconductor device according to a fifth embodiment of the present invention.

FIG. 7 shows the structure diagram of a semiconductor device according to a fifth embodiment of the present invention. As compared to FIG. 5, the restoring circuit 72 of FIG. 7 has a NOT gate 723 consisted of two transistors T1 and T2, wherein T1 is a working transistor and T2 is a load transistor; the gate of T1 receives an input signal and its source is grounded; the gate and the drain of the load transistor T2 are connected to a supply VDD together, VDD can be the first voltage source Vdd-1 or the second voltage source Vdd-2 in different embodiments, and preferably, is the first voltage source Vdd-1; the gate of T1 is connected to the source of T2, connecting the output to the gate of the NMOS transistor 522. The NOT gate consisted of NMOS transistors can prevent similar issues as the PMOS transistor 11 introduced by a NOT gate implemented by PMOS transistors. Those skilled in the art can understand that the NOT gate also can be implemented with NMOS transistors and resistive loads in other manners.

It should be noted that the NMOS and PMOS transistors shown in FIGS. 1 to 7 are enhancement transistors and the technical scheme of the present invention also applicable to depletion NMOS and PMOS transistors.

The description of the present invention is given for illustration and description, and is not exhaustive or to limit the present invention to the disclosed form. Many modification and changes are obvious to those skilled in the art. The embodiments are chosen and described to better explain the principle and the actual use of the present invention and enable those skilled in the art to understand the present invention so as to design embodiments with various modifications suitable for particular uses.

What is claimed is:

1. A semiconductor device comprising a restoring circuit for a PMOS transistor, comprising,
    a restoring loop comprising,
    an NMOS transistor, having a gate, a source connected to a gate of the PMOS transistor, and a drain connected to a pre-determined NMOS drain voltage;
    wherein the NMOS drain voltage is higher than the PMOS source voltage;
    a first resistor with one end connected to the NMOS gate and another end connecting to the PMOS gate; and;
    a bi-level input voltage signal to the NMOS gate,
    wherein the low level input signal keeps the PMOS gate at a low voltage, wherein the high level input signal turns on the NMOS transistor and increases the PMOS gate voltage above the PMOS source voltage to enable the PMOS to restore; and
    wherein when the input voltage signal is at said high level, the voltage at the gate of the PMOS is higher than the input signal voltage.

2. The semiconductor device according to claim 1, wherein the restoring loop further comprises a second resistor through which the NMOS source is connected to the PMOS gate.

3. The semiconductor device according to claim 1, wherein the first resistor is a polysilicon resistor.

4. The semiconductor device according to claim 1, wherein the first resistor is a metal line resistor.

5. The semiconductor device according to claim 1, wherein the PMOS source voltage is an operation voltage of a kernel circuit, and the NMOS transistor drain voltage is a supply voltage of a peripheral circuit.

6. The semiconductor device according to claim 5, wherein the PMOS source voltage is 0.9V, 1.0V, or 1.2V, and the NMOS transistor drain voltage is 1.5V, 1.7V, 2.5V, or 3.3V.

7. The semiconductor device according to claim 6, wherein the restoring loop and the PMOS transistor are implemented in an on-chip circuit.

8. The semiconductor device according to claim 1, wherein when the input voltage signal is at a low level, the restoring loop causes the voltage at the gate of the PMOS transistor to be substantially equal to the input signal voltage.

9. In a semiconductor device, a method for restoring a PMOS transistor, comprising,
    forming an NMOS transistor having a gate, a source connected gate of the PMOS transistor, and a drain connected to a pre-determined NMOS transistor drain voltage that is higher than the PMOS source voltage;
    forming a first resistor connected to the NMOS gate at one end the PMOS gate at another end;
    and,
    applyong a bi-level signal to the NMOS gate,
    wherein the input signal's low level keeps the PMOS gate at a low voltage,
    wherein the input signal's high level turns on the NMOS transistor and increases the PMOS gate voltage above the PMOS source voltage to enable the PMOS to restore; and
    wherein when the input voltage signal is at said high level, the voltage at the gate of the PMOS is higher than the input signal voltage.

10. The method according to claim 9, wherein the restoring loop further comprises a second resistor through which the NMOS source is connected to the PMOS gate.

11. The method according to claim 9, wherein the first resistor is a polysilicon resistor.

12. The method according to claim 9, wherein the first resistor is a metal line resistor.

13. The method according to claim 9, wherein the PMOS source voltage is an operation voltage of a kernel circuit, and the NMOS transistor drain voltage is a supply voltage of a peripheral circuit.

14. The method according to claim 13, wherein the PMOS source voltage is 0.9V, 1.0V, or 1.2V, and the NMOS transistor drain voltage is 1.5V, 1.7V, 2.5V, or 3.3V.

15. The method according to claim 9, wherein the restoring loop and the PMOS transistor are implemented in an on-chip circuit.

16. The method according to claim 9, wherein when the input voltage signal is at a low level the restoring loop causes the voltage at the gate of the PMOS transistor to be substantially equal to the input signal voltage.

* * * * *